United States Patent
Takeda et al.

(10) Patent No.: US 8,232,578 B2
(45) Date of Patent: Jul. 31, 2012

(54) LIGHT EMITTING SEMICONDUCTOR DEVICE

(75) Inventors: Shigeo Takeda, Aichi-ken (JP); Hiroyuki Tajima, Aich-ken (JP); Shota Shimonishi, Aichi-ken (JP); Yosuke Tsuchiya, Aich-ken (JP)

(73) Assignee: Toyoda Gosei Co., Ltd., Nishikasugai-gun, Aichi-ken (JP)

( * ) Notice: Subject to any disclaimer, the term of this patent is extended or adjusted under 35 U.S.C. 154(b) by 406 days.

(21) Appl. No.: 12/585,058

(22) Filed: Sep. 2, 2009

(65) Prior Publication Data

US 2010/0052006 A1    Mar. 4, 2010

(30) Foreign Application Priority Data

Sep. 3, 2008 (JP) ................................ P2008-225730

(51) Int. Cl.
*H01L 33/00* (2010.01)
(52) U.S. Cl. .................. 257/100; 257/98; 257/E33.059; 257/E33.061; 257/E33.067; 313/503
(58) Field of Classification Search ............ 257/79–103; 313/503–506
See application file for complete search history.

(56) References Cited

U.S. PATENT DOCUMENTS

2009/0015137 A1 * 1/2009 Su et al. ......................... 313/503
2009/0321758 A1 * 12/2009 Liu et al. ......................... 257/98

FOREIGN PATENT DOCUMENTS

| JP | 2004-193394 | | 7/2004 |
| JP | 2006-324256 | | 11/2006 |
| JP | 2006324256 A | * | 11/2006 |
| JP | 2007088071 A | * | 4/2007 |
| JP | 2007109948 A | * | 4/2007 |
| JP | 2007-324630 | | 12/2007 |

* cited by examiner

*Primary Examiner* — Telly Green
(74) *Attorney, Agent, or Firm* — McGinn IP Law Group, PLLC (57) ABSTRACT

A light emitting semiconductor device includes a base substrate; a light emitting semiconductor element including a crystal growth basis and provided on the base substrate so that the crystal growth basis faces in opposite direction to the base substrate; a first transparent sealing medium which seals the light emitting semiconductor on the base substrate; and a second transparent sealing medium which seals the light emitting semiconductor over the first transparent sealing medium and contains phosphor. A thickness of the second sealing medium in a portion with high emission intensity is larger than that of the other portion of the first sealing medium; and the portion with high emission intensity is defined as a portion where light emission intensity from the light emitting semiconductor element is maximum.

20 Claims, 9 Drawing Sheets

LIGHT EMITTING SEMICONDUCTOR DEVICE

CROSS-REFERENCE TO RELATED APPLICATIONS

This application claims priority from Japanese Patent Application No. 2008-225730 filed on Sep. 3, 2008 and subject matters of which are incorporated herein by reference.

TECHNICAL FIELD

This invention relates to a light emitting semiconductor device for emitting white light using a light emitting semiconductor element for emitting blue light and a phosphor.

BRIEF DESCRIPTION OF RELATED ART

For example, a light emitting semiconductor device described in patent document 1 mentioned below, etc., is known as the light emitting semiconductor device for emitting white light using a light emitting semiconductor element for emitting blue light and a phosphor. The related art unit in JP-A-2007-324630 is intended for relatively increasing the thickness of a resin layer of a main light taking-out plane, thereby providing light with no color shading.

Figure 8:
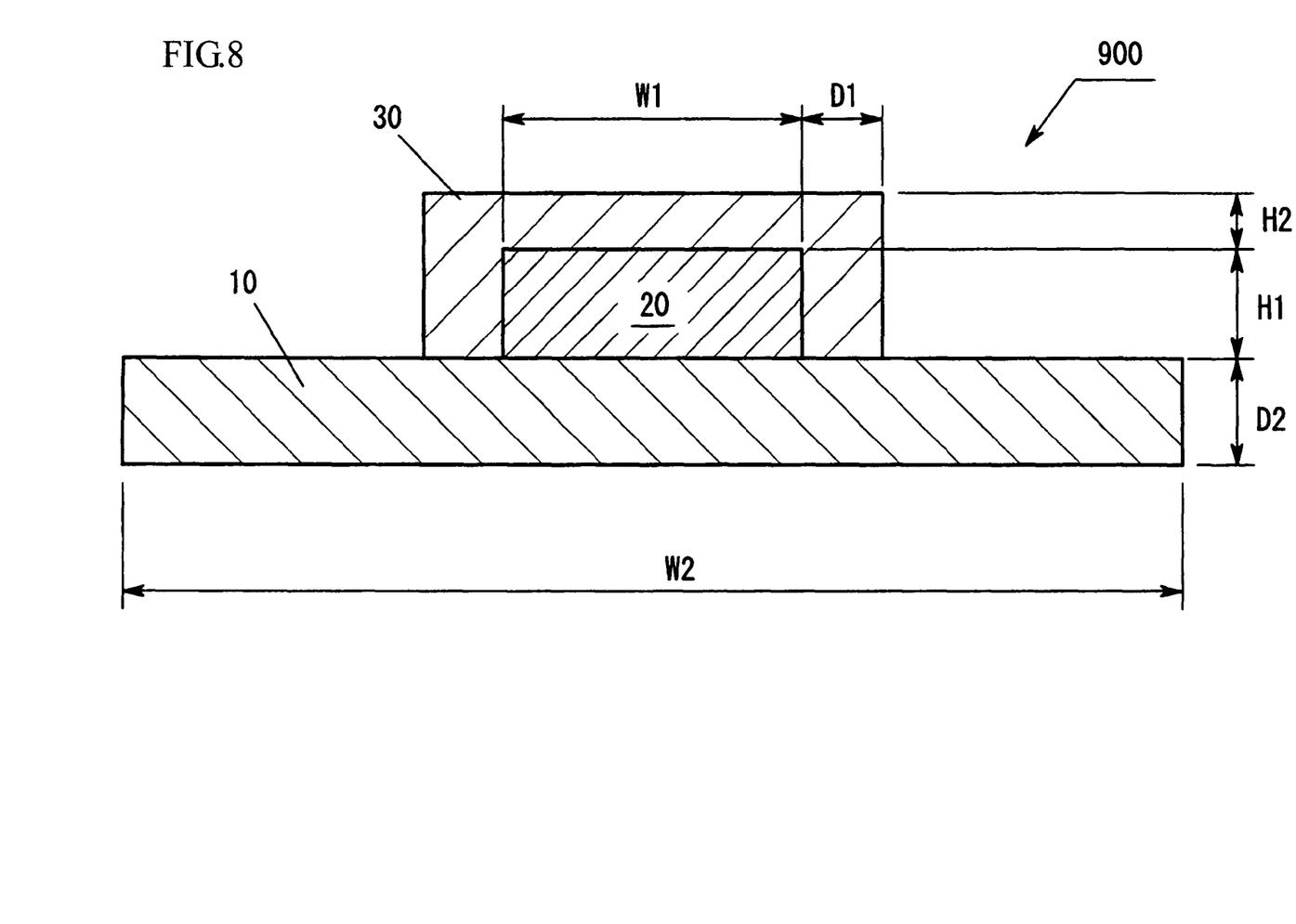
FIG. 8 is a sectional view of a light emitting semiconductor device 900 in a related art.
Figure 9:
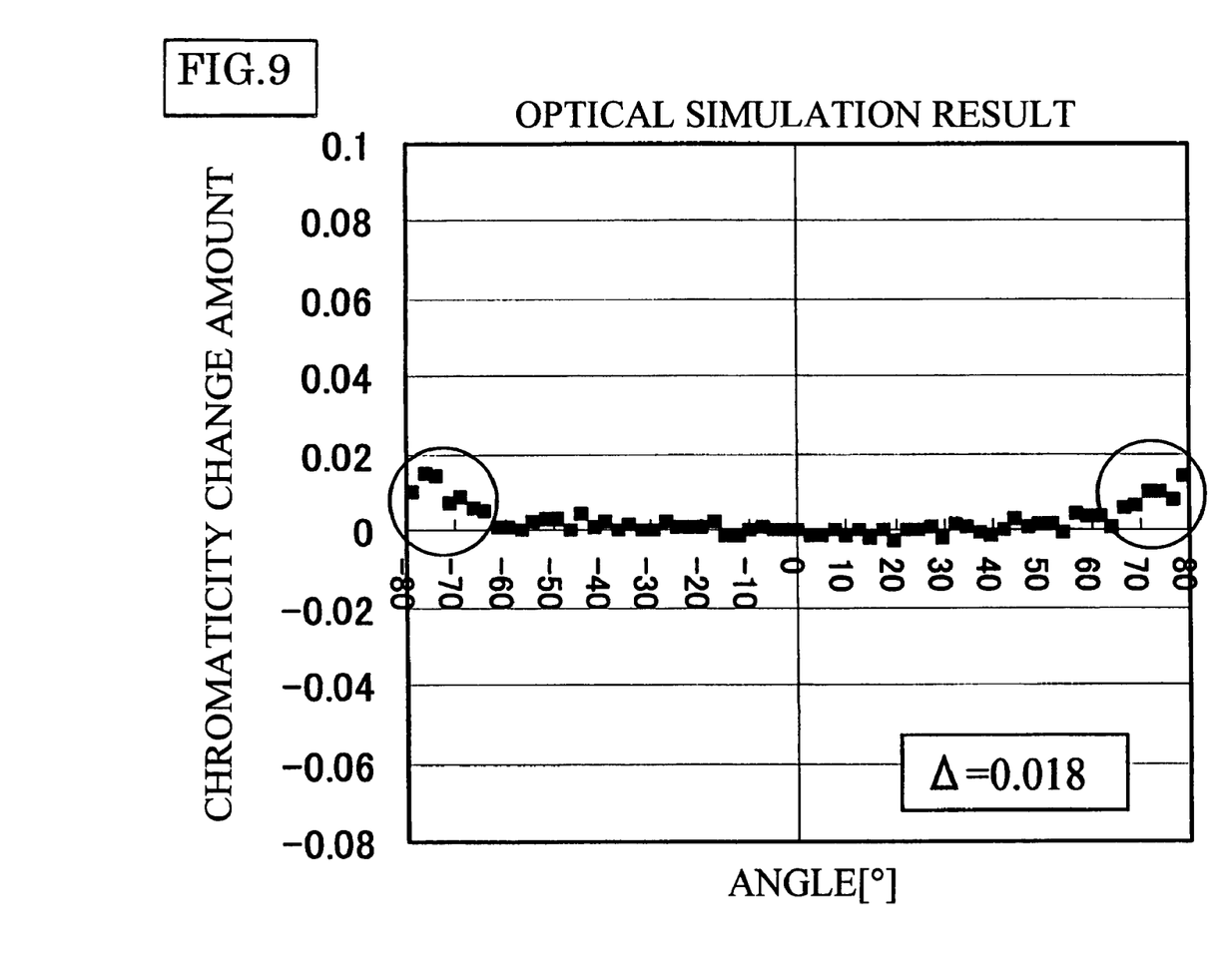
FIG. 9 is a graph to show the optical simulation result according to the light emitting semiconductor device 900.

FIG. 8 is a sectional view of a general light emitting semiconductor device in another related art. A light emitting semiconductor device 900 has a light emitting semiconductor element 20 having a sapphire substrate for emitting blue light sealed with a sealing medium 30 made of an epoxy resin on a ceramic base substrate 10. The sealing medium 30 contains a phosphor for converting blue light into yellow light. Here, the light emitting semiconductor element 20 is sealed face down so that the sapphire substrate faces in opposite direction to the base substrate. With the light emitting semiconductor device 900, it is generally known that emitted light in the outer edge at a distance from the optical axis takes on a yellow tinge. FIG. 9 shows the optical simulation result of the situation. The horizontal axis of FIG. 9 represents the emission azimuth of light and the vertical axis represents the value of x component Cx of the chromaticity of each azimuth with the chromaticity of the optical axis as the reference. The simulation result very much matches the measurement result. From the graph, it is seen that the chromaticity around 60° to 80° on each of the left and the right shifts to the yellow side. A symbol Δ in the graph denotes the maximum value of the shift width.

Figure 1:
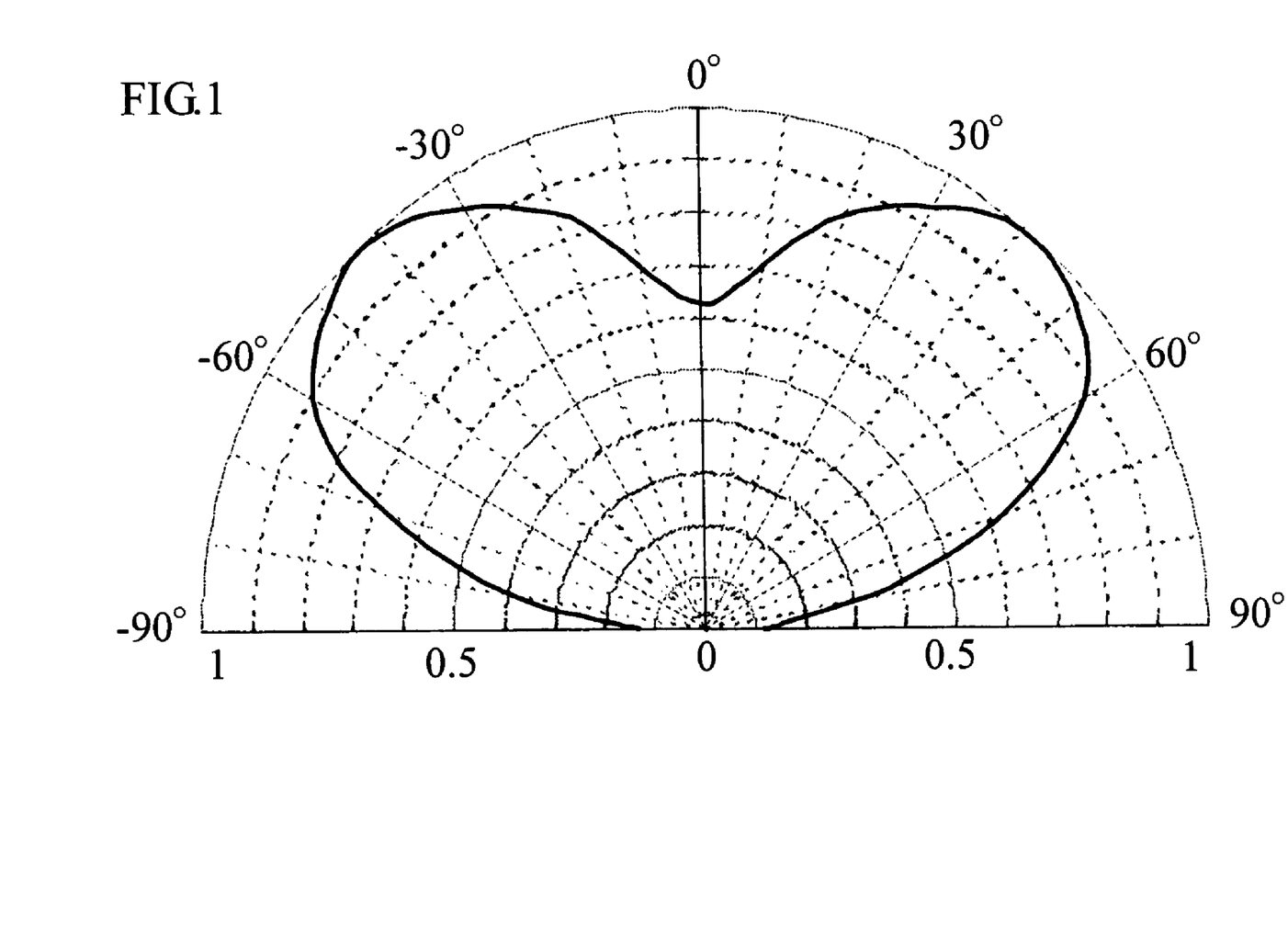
FIG. 1 is a graph to illustrate the directional characteristics of the emission intensity of a face down light emitting semiconductor element.

The optical simulation was executed by assuming that
(1) peak wavelength of emission spectrum of light emitting semiconductor element 20: 446 nm
(2) peak wavelength of emission spectrum of used phosphor: 564 nm
(3) dimensions of components of light emitting semiconductor device 900 (FIG. 8)
   (a) width W1 of light emitting semiconductor element 20: 1000 µm
   (b) height H1 of light emitting semiconductor element 20: 375 µm
   (c) thickness H2 of top portion of sealing medium 30: 200 µm
   (d) thickness D1 of side wall portion of sealing medium 30: 250 µm
   (e) width W2 of base substrate 10: 3500 µm
   (f) thickness D2 of base substrate 10: 400 µm In the above described optical simulation, it was assumed that the volume density of the phosphor is constant everywhere in the sealing medium 30. The values on a graph shown in FIG. 1 were assumed as the directional characteristics of the emission intensity of the light emitting semiconductor element 20. The angle on the semi-circle in FIG. 1 means the angle measured clockwise on the plane containing a normal which is defined at the center of bottom surface of the sapphire substrate. The angle is set 0° on the optical axis. Hereinafter, the angle will be referred to as radiation azimuth angle and the radiation center is the center of the light emission layer. If the light emitting semiconductor element having a sapphire substrate emits light in the face down condition, light easily gathers in the outer edge of the sapphire substrate. Thus, usually the peak of the emission intensity appears in the vicinity of a portion where the radiation azimuth angle becomes about ±45° (namely, in the vicinity of 45° on the left and the right) as illustrated in FIG. 1.

SUMMARY

Figure 2:
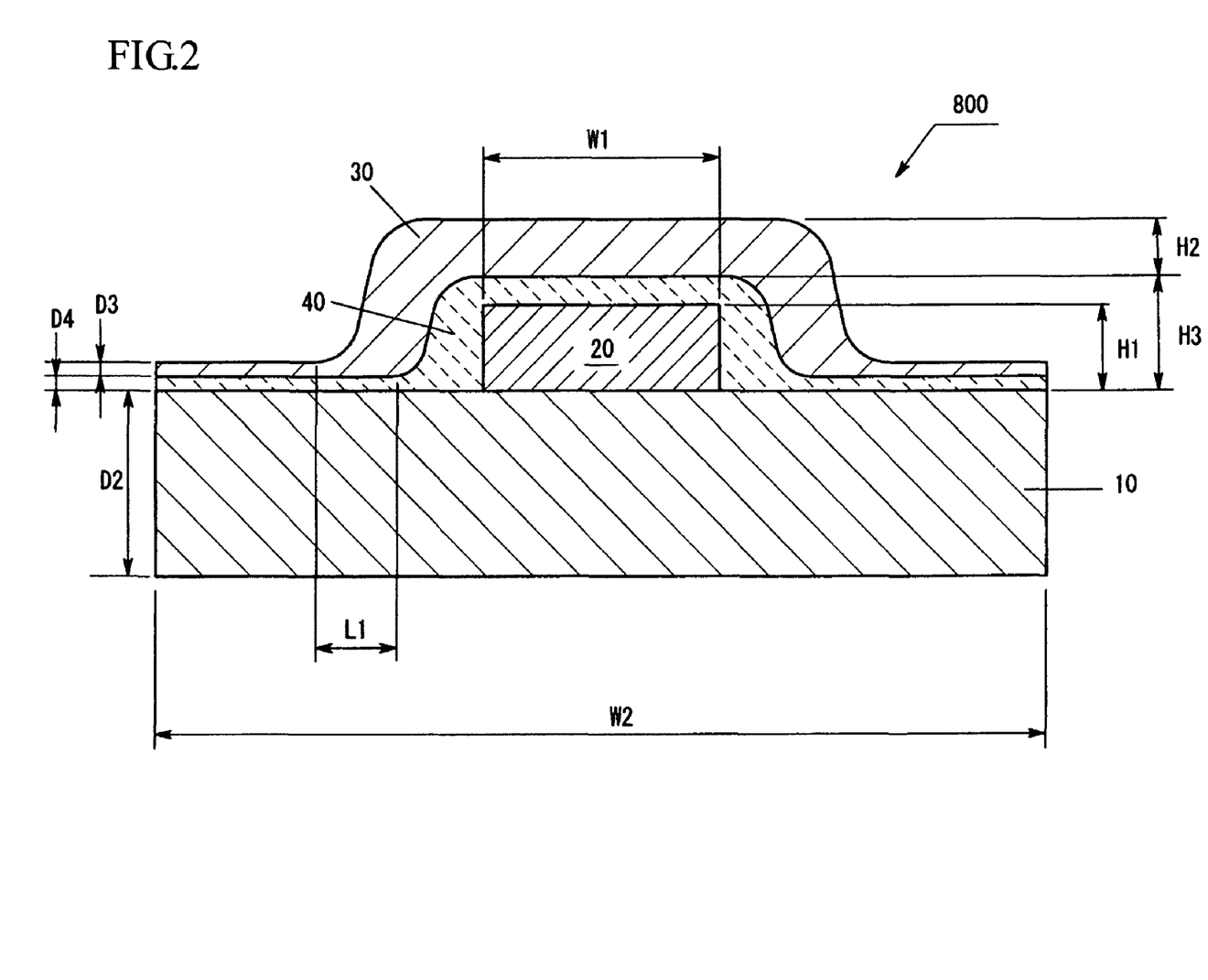
FIG. 2 is a sectional view of a light emitting semiconductor device 800.

To solve the problem of the chromaticity shift to the yellow side as described above, the inventor et al. conceived of a two-layer structure sealing medium used for a light emitting semiconductor device. FIG. 2 shows the two-layer structure. In a light emitting semiconductor device 800, a first sealing medium 40 for directly sealing a light emitting semiconductor element 20 is formed of a transparent resin material containing no phosphor. The first sealing medium 40 is sealed with a second sealing medium 30 which contains a phosphor. The shape of a sealing medium to be produced in quantity involves a strong restriction such that a taper shape, an R shape, etc., must be provided everywhere to easily extract the sealing medium from a mold. However, the inventor et al. recognized that the flexibility of the design concerning the thickness of the second sealing medium 30 containing a phosphor can be easily enhanced by placing the sealing medium in the two-layer structure.

Figure 3:
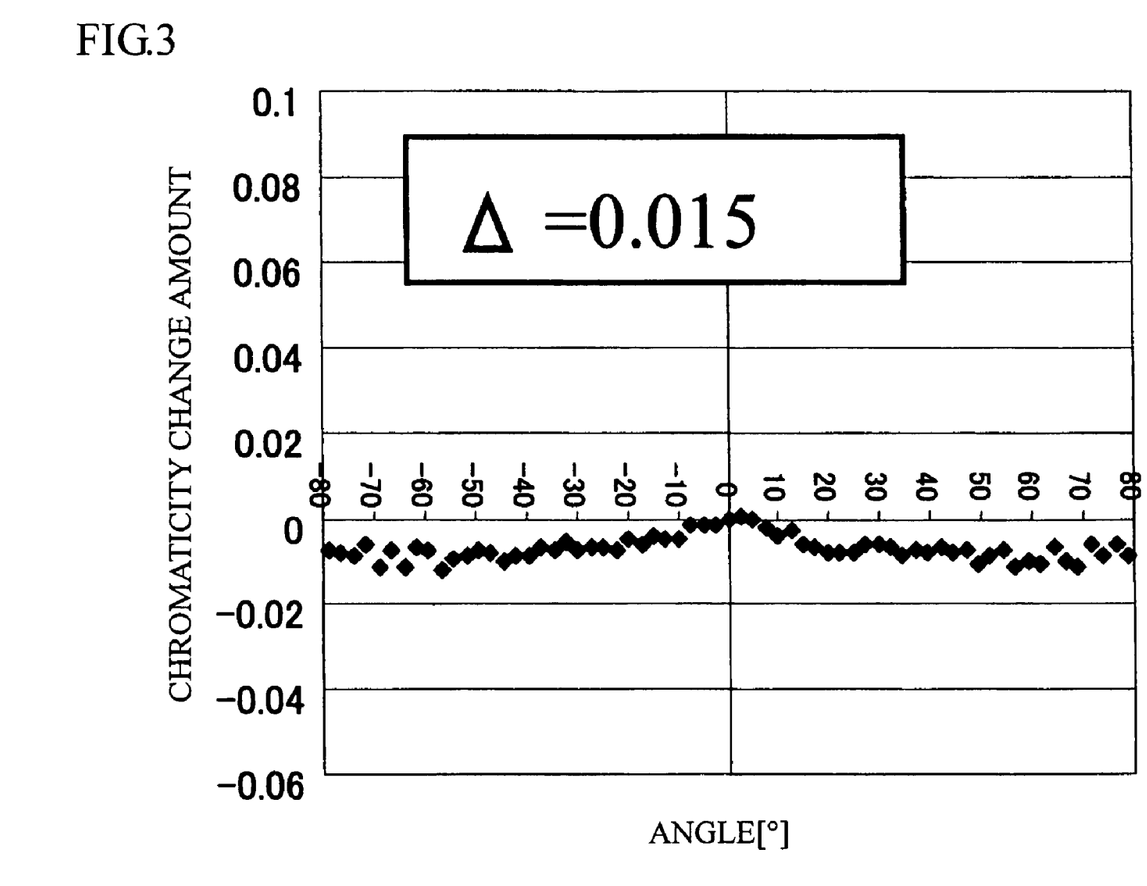
FIG. 3 is a graph to show the optical simulation result according to the light emitting semiconductor device 800.

Then, as a result of the optical simulation for the light emitting semiconductor device 800, a tinge of blue sifts is observed in each portion except the proximity of the optical axis. FIG. 3 shows the situation. In FIG. 3, as in FIG. 9, the vertical axis represents the value of x component Cx of the chromaticity of each azimuth with the chromaticity of the optical axis as the reference. From the graph, it is seen that the chromaticity in the area from 10° to 80° on each of the left and the right shifts to the negative side, namely, the blue side.

The optical simulation was executed by assuming that
(1) peak wavelength of emission spectrum of light emitting semiconductor element 20: 446 nm
(2) peak wavelength of emission spectrum of used phosphor: 564 nm
(3) dimensions of components of light emitting semiconductor device 800 (FIG. 2)
   (a) width W1 of light emitting semiconductor element 20: 1000 µm
   (b) height H1 of light emitting semiconductor element 20: 375 µm
   (c) thickness H2 of top portion of sealing medium 30: 200 µm
   (d) height H3 of sealing medium 40: 475 µm
   (e) width W2 of base substrate 10: 3500 µm
   (f) thickness D2 of base substrate 10: 400 µm
   (g) thickness D3 of outer edge of sealing medium 30: 50 µm
   (h) thickness D4 of outer edge of sealing medium 40: 50 µm
   (i) distance L1 between falling positions of sealing medium 30 and sealing medium 40: 250 µm The values on the graph shown in FIG. 1 were assumed as the directional characteristics of the emission intensity of the light emitting semiconductor element 20 as with the case of the light emitting semiconductor device 900. It was assumed that the volume density of the phosphor is constant everywhere in the second sealing medium 30.

In the simulation result in FIG. 3, the value of the maximum value Δ of the shift width of the chromaticity Cx with the optical axis as the reference decreases by 0.003 as compared with the case of the light emitting semiconductor device 900 and a given improvement concerning color shading is observed.

However, the value of the maximum value Δ of the shift width is still large as 0.015 also in the light emitting semiconductor device 800 and a further improvement concerning color shading is desired.

The invention is intended for solving the problems described above and it is an object of the invention to decrease color shading of light emission as much as possible in a light emitting semiconductor device for emitting white light. Especially, the invention is preferably applied to a light emitting semiconductor device which has a light emitting semiconductor element for emitting blue light having a sapphire substrate in the face down condition.

A light emitting semiconductor device according to the first aspect of the present invention is a light emitting semiconductor device which includes a base substrate; a light emitting semiconductor element including a crystal growth basis and provided on the base substrate so that the crystal growth basis faces in opposite direction to the base substrate; a first transparent sealing medium which seals the light emitting semiconductor on the base substrate; and a second transparent sealing medium which seals the light emitting semiconductor over the first transparent sealing medium. A width of the second sealing medium in a maximum direction is larger than that of the other portion of the second sealing medium; and the maximum direction is defined in which light emission intensity from the light emitting semiconductor element is maximum.

Especially, a preferable structure for the light emitting semiconductor device is such that the light emitting semiconductor includes a base substrate; a light emitting semiconductor element including a crystal growth basis and provided on the base substrate so that the crystal growth basis faces in opposite direction to the base substrate; a first transparent sealing medium which seals the light emitting semiconductor element on the base substrate and includes a first ceiling portion which is positioned over the light emitting semiconductor element, a first taper portion which includes a first inclined side wall and is provided so as to continue from the first ceiling portion, and a first R portion which includes a first curve and connects between the first ceiling portion and the first taper portion by the first curve; and a second sealing medium with phosphor which seals the light emitting semiconductor element over the first sealing medium and includes a second ceiling portion which is positioned over the first ceiling portion and includes a recess which dents toward the first ceiling, a second taper portion which includes a second inclined side wall and is provided so as to continue from the second ceiling portion, and a second R portion which includes a second curve and connects between the second ceiling portion and the second taper portion by the second curve.

Preferably, the first transparent sealing member includes a first ridgeline portion which extends along the base substrate at a portion where the first ridgeline portion contacts with the base substrate, and the second transparent sealing medium includes a second ridgeline portion which extends along the base substrate at a portion where the second ridgeline portion contacts with the base substrate.

It is desirable that transparent resin of the same kind should be used as the materials of the first sealing medium and the second sealing medium from the viewpoints of productivity and adhesion, but they need not necessarily be formed of material of the same kind.

A second aspect of the present invention according to the first aspect is that the first ceiling portion includes a convex which projects toward the second ceiling portion.

A third aspect of the present invention according to the first and the second aspect is that a first angle formed between the first inclined side wall and the base substrate is smaller than a second angle formed between the second inclined side wall and the base substrate.

According to these illustrative aspects of the present invention, the problems described above can be solved effectively or rationally.

The advantages according to the above described aspects of the present invention described above are as follows.

According to the first aspect of the invention, the outer shape of the first sealing medium is formed of the first ceiling portion, the ridgeline portion, the first taper portion, and the first R portion. This shape satisfies the condition of making it possible to manufacture a mold of the first sealing medium, namely, the condition to make it possible to easily extract the sealing medium from the mold. Thus, it is very convenient for producing any desired light emitting semiconductor device in quantity. The outer shape of the second sealing medium is formed of the second ceiling portion, the ridgeline portion, the second taper portion, and the second R portion. This shape also satisfies the condition of making it possible to manufacture a mold of the second sealing medium. Thus, it is very convenient for producing any desired light emitting semiconductor device in quantity.

Further, since the second ceiling portion is formed so as to have a recess portion of a curvature shape convex toward the first ceiling portion, the thickness of the second sealing medium containing a phosphor on the optical axis becomes relatively thin as compared with the thickness of any other portion. On the other hand, to seal face down the light emitting semiconductor element having the crystal growth basis, the emission intensity on the optical axis is relatively low as compared with the emission intensity in the vicinity of ±45° of radiation azimuth angle (namely, more essentially, the emission intensity in the vicinity on the line passing through the edge line of the light release face of the crystal growth basis from the center of the light emitting layer) as illustrated in FIG. 1. Consequently, the thickness of the second sealing medium in the portion with high emission intensity becomes relatively large and the thickness of the second sealing medium in the portion with low emission intensity becomes relatively thin. That is, the phosphor contained in the second sealing medium is distributed and placed in response to the light quantity passing through the second sealing medium. Therefore, according to the phosphor, the amount of light whose wavelength is converted is distributed in response to the light quantity of each portion of the light emitting unit. Thus, the light emitting semiconductor device of the invention, color shading is more decreased than was previously possible and a structure suited for mass production is also provided.

According to the second aspect of the invention, since the first ceiling portion is formed so as to have a convex portion of a curvature shape convex toward the second ceiling portion, the thickness of the second sealing medium deposited thereon can be set thin as much as the swelling on the optical axis.

Therefore, also according to the setting, the thickness of the second sealing medium in the portion with high emission intensity becomes relatively large and the thickness of the second sealing medium in the portion with low emission intensity becomes relatively thin. Thus, according to the second means, color shading is also more decreased than was previously possible and a structure suited for mass production is also provided.

According to the third aspect of the invention, the thickness of the side wall portions of the second sealing medium (taper portion and ridgeline portion) can be made thinner as approaching the support face of the base substrate. Thus, the phosphor distribution amount can be set less in the area with low emission intensity on sides of the light emitting semiconductor element in the vicinity of radiation azimuth angle from −90° to −60° and in the vicinity of radiation azimuth angle from 60° to 90°. Therefore, also according to the setting, the thickness of the second sealing medium in the portion with high emission intensity becomes relatively larger than the thickness of any other portion and the thickness of the second sealing medium in the portion with low emission intensity becomes relatively thin. Thus, according to the third means, color shading is also more decreased than was previously possible and a structure suited for mass production is also provided.

DETAIL DESCRIPTION OF EXEMPLARY EMBODIMENT OF THE PRESENT INVENTION

The invention will be discussed based on specific embodiments.

However, the embodiments of the invention are not limited to the following embodiments.

Exemplary Embodiment 1

Figure 4:
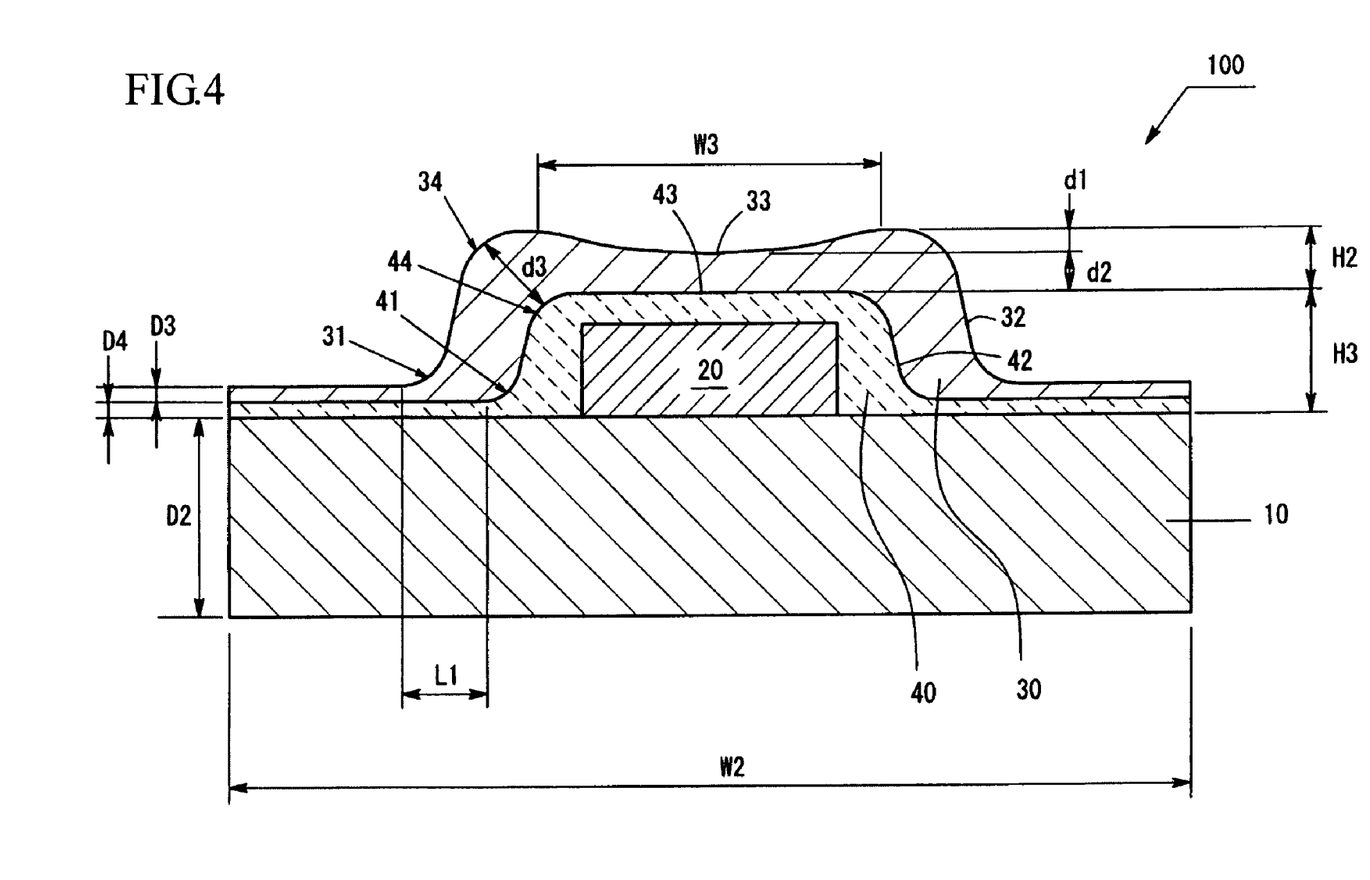
FIG. 4 is a sectional view of a light emitting semiconductor device 100 of an exemplary embodiment 1 of the invention.

FIG. 4 is a sectional view of a light emitting semiconductor device 100 of embodiment 1 of the invention. The light emitting semiconductor device 100 has a light emitting semiconductor element 20 having a sapphire substrate for emitting blue light sealed on a ceramic base substrate 10. A first sealing medium 40 for sealing the light emitting semiconductor element 20 directly on the base substrate 10 is formed of a transparent silicone resin. A second sealing medium 30 for further sealing the first sealing medium 40 from the outside is formed of a transparent silicone resin uniformly containing a known YAG phosphor for converting blue light into yellow light. The light emitting semiconductor element 20 is manufactured by depositing a III group nitride based compound semiconductor on the sapphire substrate by crystal growth; in the light emitting semiconductor device 100, the light emitting semiconductor element 20 is sealed in face down condition so that the sapphire substrate faces in opposite direction to the base substrate.

The first sealing medium 40 has a first ridgeline portion 41 extending along a support plane of the base substrate in a joint portion in contact with the base substrate 10, and a first taper portion 42 made of a side wall slantingly inclined at an inclination angle of 82.45° extends upward from the ridgeline portion 41. However, the inclination angle is defined as a not large angle of angles measured from the support plane of the base substrate. A first R portion 44 of the first sealing medium 40 connects a first ceiling portion 43 of a flat ceiling portion of the first sealing medium 40 and the first taper portion 42 by a curved surface. The first sealing medium 40 has such a shape for sealing the light emitting semiconductor element 20 on the ceiling portion of the base substrate 10.

Since the first sealing medium 40 is further sealed from the outside with the second sealing medium 30, the outer shape of the second sealing medium 30 is formed roughly along the outer shape of the first sealing medium 40. That is, the second sealing medium 30 has a second ridgeline portion 31 extending along the support plane of the base substrate 10 in a portion where the second ridgeline portion 31 contacts with the first ridge line portion 41, and a second taper portion 32 made of a side wall slantingly inclined at an inclination angle of 85° extends from the ridgeline portion 31. Therefore, the inclination angle of the second taper portion 32 is larger than the inclination angle of the first taper portion 42 and thus the thickness of the second sealing medium 30 is smaller toward the second ridgeline portion from a second R portion 34. A second ceiling portion 33 of a ceiling portion of the second sealing medium 30 is formed of a recess portion of a curvature shape convex toward the first ceiling portion and accordingly, the top portion of the second sealing medium 30 is formed with a dent having width W3 and depth d1. The second R portion 34 of the second sealing medium 30 connects the second ceiling portion 33 and the second taper portion 32 by a curved surface.

Figure 5:
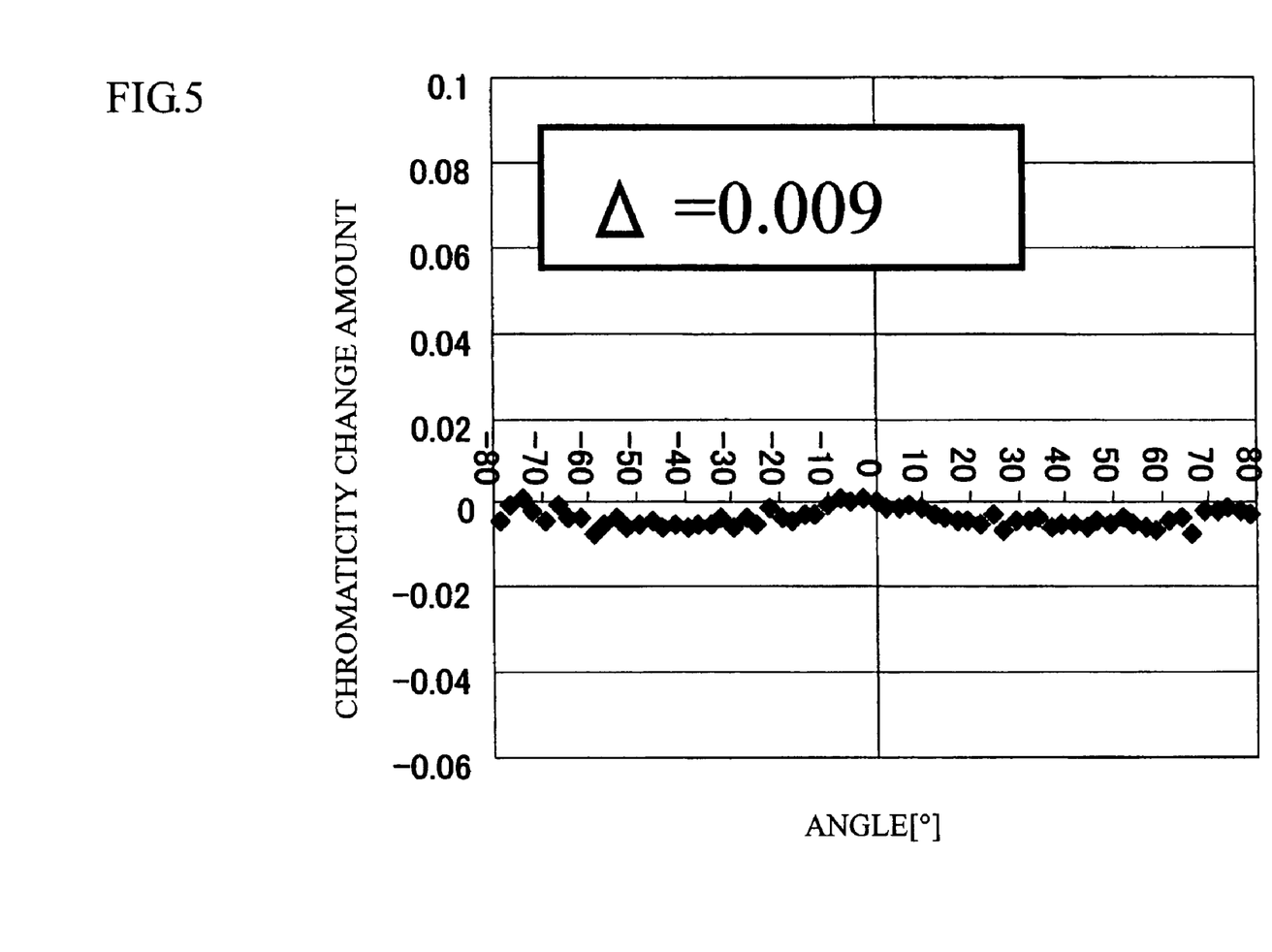
FIG. 5 is a graph to show the optical simulation result according to the light emitting semiconductor device 100.

FIG. 5 is a graph to show the optical simulation result according to the light emitting semiconductor device 100. The horizontal axis of the graph indicates the emission azimuth of light with radiation azimuth angle from −80° to +80° (from left 80° to right 80°), and the vertical axis indicates the relative value (shift amount) of x component Cx of the chromaticity of each azimuth with the chromaticity of light emission on the optical axis (azimuth angle 0°) as the reference (0.00). A symbol Δ denotes the maximum value of the shift width over all azimuths. From the graph, as for the light emitting semiconductor device 100, it is seen that a slight blue shift involved in the chromaticity is observed in the area from radiation azimuth angle −70° to −10° and the area from radiation azimuth angle 10° to 70°. However, the shift width of the chromaticity is sufficiently small (0.009 even at the maximum). Since blue has luminous efficacy lower than yellow, color shading indicated by the shift amount to the blue side is comparatively hard to recognize. Thus, according to the configuration the light emitting semiconductor device 100 of embodiment 1, it is seen that a light emitting unit for emitting white light with sufficiently suppressed color shading of light emission can be manufactured.

It is considered that the reason why color shading thus decreases effectively is that wavelength conversion of the amount matching the directional characteristics of the emission intensity in FIG. 1 is performed by making the thickness of the second sealing medium 30 in the second R portion 34 relatively larger than the thickness of any other portion of the second sealing medium 30. That is, since the light emitting semiconductor element 20 is sealed in a face down condition so that the sapphire substrate faces in opposite direction to the base substrate, the emission intensity in the vicinity of ±45° of radiation azimuth angle is strong, namely, the luminous flux density in the direction piercing the second R portion 34 is high; it seems that color shading of light emission is suppressed because the thickness of the second sealing medium 30 in the second R portion 34 at the corresponding position increases conforming to the emission intensity.

The optical simulation according to the light emitting semiconductor element 100 was executed by assuming that (1) peak wavelength of emission spectrum of light emitting semiconductor element 20: 446 nm (2) peak wavelength of emission spectrum of used phosphor: 564 nm (3) dimensions of components of light emitting semiconductor device 100 (FIG. 4)

(a) width of light emitting semiconductor element 20: 1000 μm (b) height of light emitting semiconductor element 20: 375 μm (c) thickness H2 of top portion of sealing medium 30: 250 μm (d) height H3 of sealing medium 40: 475 μm (e) width W2 of base substrate 10: 3500 μm (f) thickness D2 of base substrate 10: 400 μm (g) thickness D3 of outer edge of sealing medium 30: 50 μm (h) thickness D4 of outer edge of sealing medium 40: 50 μm (i) distance L1 between falling positions of sealing medium 30 and sealing medium 40: 250 μm (j) depth d1 of dent of ceiling portion 33: 90 μm (k) width W3 of dent of ceiling portion 33: 1200 μm (l) curvature radius of ceiling portion 33: 1993 μm The values on the graph shown in FIG. 1 were assumed as the directional characteristics of the emission intensity of the light emitting semiconductor element 20 as with the case of the light emitting semiconductor device 800. That is, it was assumed that the light emitting semiconductor element 20 has the directional characteristics having the peak of the emission intensity in the vicinity of ±45° of radiation azimuth angle. It was assumed that the volume density of the phosphor is constant everywhere in the second sealing medium 30.

If the desirable inclination angle of the first taper portion 42 is too small, the chromaticity shift to the blue side over a wide range easily becomes noticeable. If the inclination angle is too large, it becomes difficult to thin the thickness of the second sealing medium 30 in the vicinity of the second ridgeline portion 31.

It is desirable that the inclination angle of the second taper portion 32 should be set larger than the inclination angle of the first taper portion 42. If the angle difference is too large, it becomes difficult to extract the second sealing medium 30 from a mold. If the angle difference is too small, it becomes difficult to thin the thickness of the second sealing medium 30 in the vicinity of the second ridgeline portion 31.

If the value of the depth d1 of the dent of the ceiling portion 33 is too small, it becomes difficult to provide the advantages of the invention. If the value is too large, the chromaticity in the vicinity of the optical axis easily shifts to the blue side. The proper range is observed, whereby the proper range of the depth d1 of the dent of the second ceiling portion 33 can be observed.

The shapes of the ridgeline portion 41 of the first sealing medium 40 and the ridgeline portion 31 of the second sealing medium 30 contribute to enlarging of the joint area with the base substrate 10, so that the sealing media of the light emitting semiconductor element 100 have features of being hard to peel off from the base substrate 10. Using of the same resin material for the first sealing medium 40 and the second sealing medium 30 also contributes to the feature of being hard to peel off from each other.

Exemplary Embodiment 2

Figure 6:
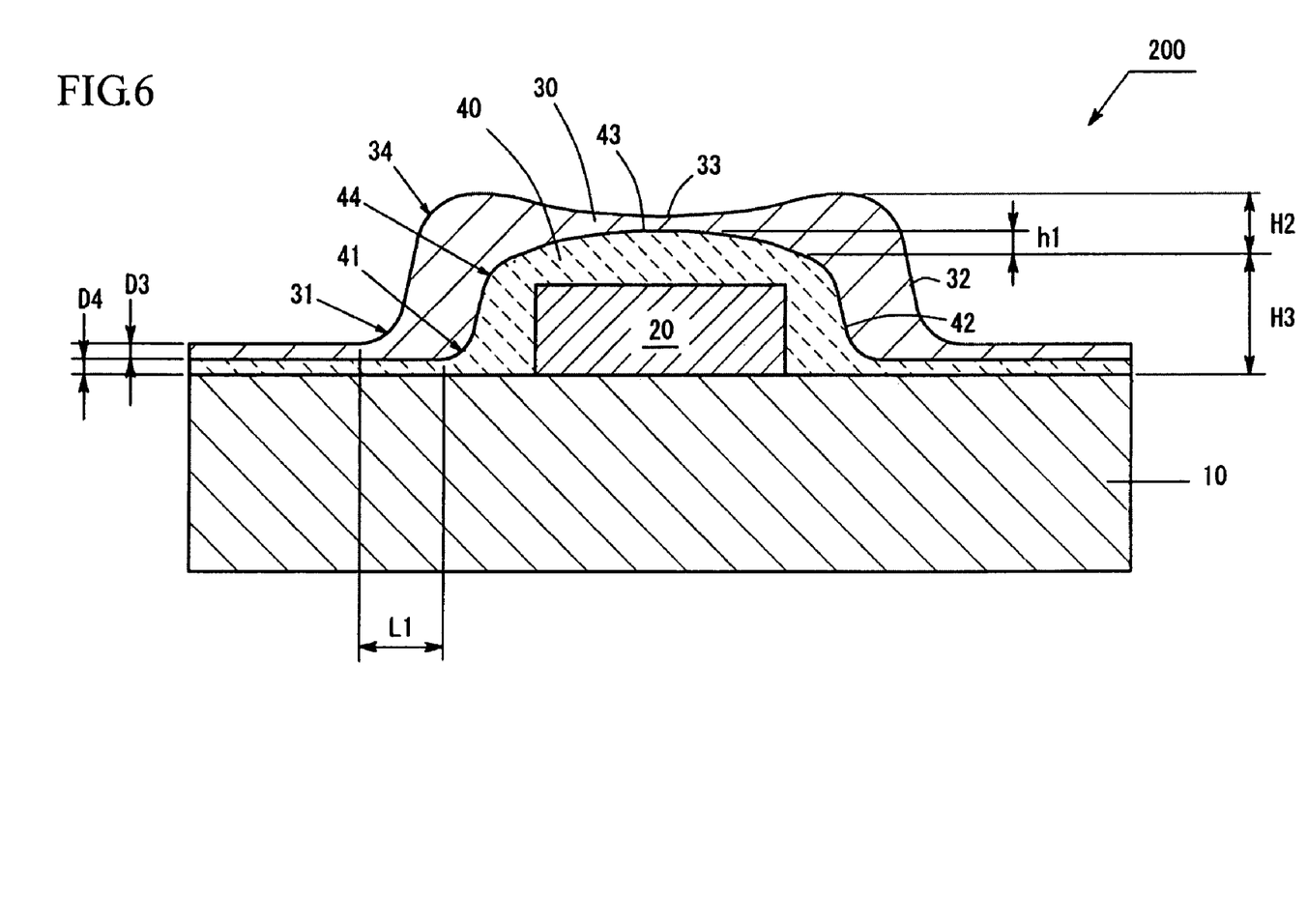
FIG. 6 is a sectional view of a light emitting semiconductor device 200 of embodiment 2 of the invention.

FIG. 6 is a sectional view of a light emitting semiconductor device 200 of embodiment 2 of the invention. The light emitting semiconductor device 200 has a structure remarkably similar to that of the light emitting semiconductor device 100 of embodiment 1; they differ only in the shape of first ceiling portion 43 of first sealing medium 40. The first ceiling portion 43 of the light emitting semiconductor device 200 is formed having a convex portion of a curvature shape convex toward a second ceiling portion 33 and the highest point of the center of the swelling is set higher by h1 =50 μm than the height of the first ceiling portion 43 of the light emitting semiconductor device 100 of embodiment 1 described above. The curvature radius of the convex portion of the first ceiling portion 43 is 1829 μm.

If the height h1 of the convex portion is too large, light emission on the optical axis shifts to the blue side and this shift is undesirable.

Figure 7:
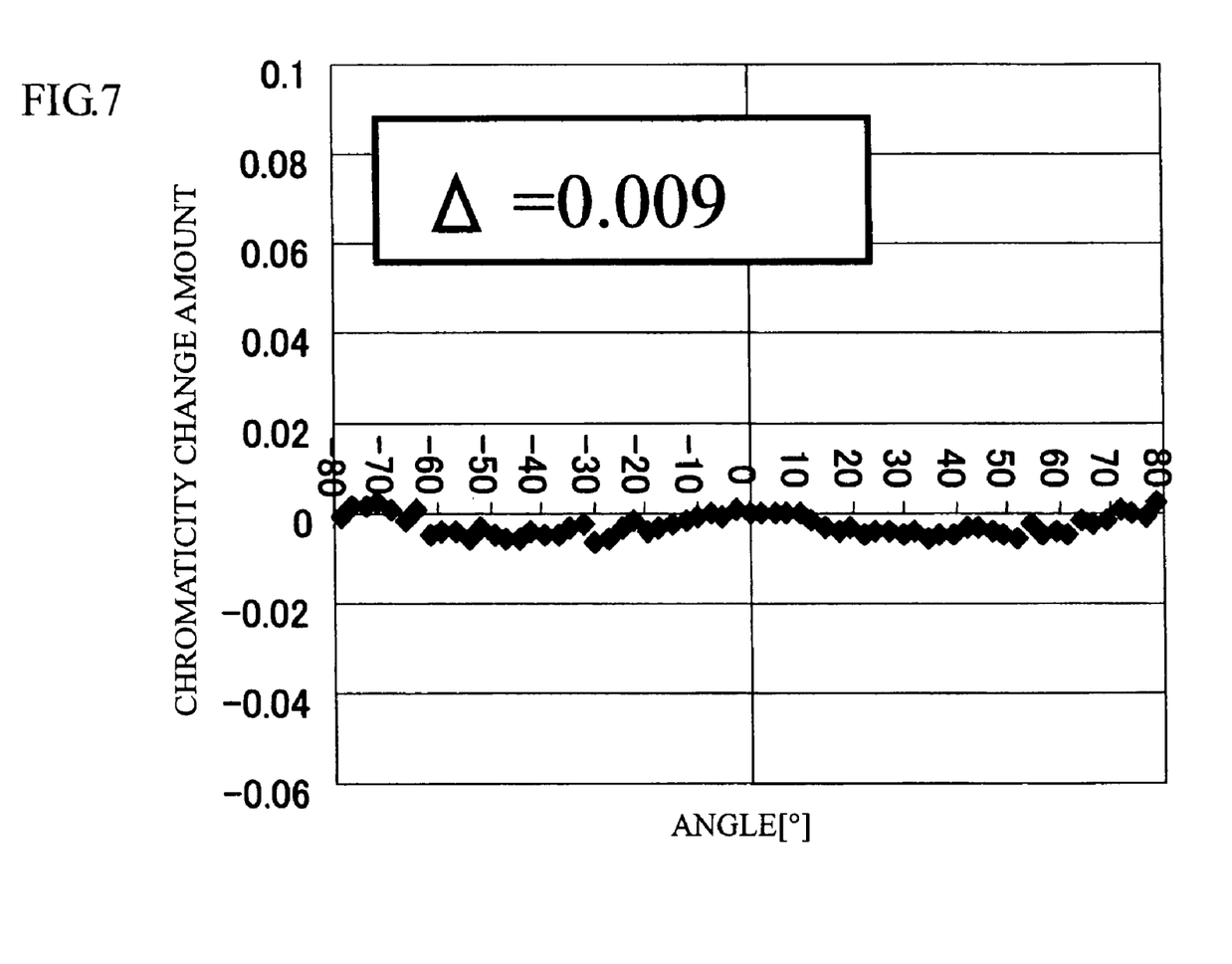
FIG. 7 is a graph to show the optical simulation result according to the light emitting semiconductor device 200.

FIG. 7 is a graph to show the optical simulation result according to the light emitting semiconductor device 200. The optical simulation was executed under the same assumption conditions as those of embodiment 1 except for the shape of the first ceiling portion 43. The horizontal axis of the graph in FIG. 7 indicates the emission azimuth angle of light with radiation azimuth angle from −80° to +80°, and the vertical axis indicates the relative value (shift amount) of x component Cx of the chromaticity of each azimuth with the chromaticity of light emission on the optical axis (azimuth angle 0°) as the reference (0.00). A symbol Δ denotes the maximum value of the shift width over all azimuths. From the graph, as for the light emitting semiconductor device 200, it is seen that a slight blue shift involved in the chromaticity is observed in the area from radiation azimuth angle −60° to −20° and the area from radiation azimuth angle 20° to 60°. However, the shift width of the chromaticity is sufficiently small (0.009 even at the maximum). Thus, according to the configuration of the light emitting semiconductor device 200 of embodiment 2, it is seen that a light emitting unit for emitting white light with sufficiently suppressed color shading of light emission can also be manufactured.

Additional Modifications

The embodiments of the invention are not limited to the embodiments described above and may be modified as illustrated below. Such modification and application also make it possible to provide the advantages of the invention based on the functions of the invention.

Additional Modification 1

For example, in the embodiments described above, the base substrate 10 is made of ceramics, but may be made of any desired material; for example, the base substrate 10 may be formed of a plate material with a metal film formed on the surface of a resin substrate. In the embodiments described above, the first sealing medium 40 and the second sealing medium 30 are formed of a silicone resin, but any desired transparent resin material can be used for the sealing media.

The invention claimed is:

1. A light emitting semiconductor, comprising:
a base substrate;
a light emitting semiconductor element including a crystal growth basis and provided on the base substrate so that the crystal growth basis faces in an opposite direction to the base substrate;
a first transparent sealing medium which seals the light emitting semiconductor element on the base substrate and includes a first ceiling portion which is positioned over the light emitting semiconductor element, a first taper portion which includes a first slantingly inclined side wall and is provided so as to continue from the first ceiling portion, and a first R portion which includes a first curve and connects between the first ceiling portion and the first taper portion by the first curve; and
a second sealing medium which comprises a phosphor and seals the light emitting semiconductor element over the first sealing medium and includes a second ceiling portion which is positioned over the first ceiling portion and includes a recess which dents toward the first ceiling, a second taper portion which includes a second slantingly inclined side wall and is provided so as to continue from the second ceiling portion, and a second R portion which includes a second curve and connects between the second ceiling portion and the second taper portion by the second curve,
wherein an inclination angle of the second slantingly inclined side wall is more than an inclination angle of the first slantingly inclined side wall.

2. The light emitting semiconductor device according to claim 1, wherein the first transparent sealing Medium includes a first ridgeline portion which extends along the base substrate in a portion where the first ridgeline portion contacts with the base substrate, and
wherein the second transparent sealing medium includes a second ridgeline portion which extends along the base substrate in a portion where the second ridgeline portion contacts with the first ridgeline portion.

3. The light emitting semiconductor device according to claim 1, wherein the first ceiling portion includes a convex which projects toward the second ceiling portion.

4. The light emitting semiconductor device according to claim 1, wherein a first angle formed between the first slantingly inclined side wall and the base substrate is smaller than a second angle formed between the second slantingly inclined side wall and the base substrate.

5. The light emitting semiconductor device according to claim 3, wherein a first angle formed between the first slantingly inclined side wall and the base substrate is smaller than a second angle formed between the second slantingly inclined side wall and the base substrate.

6. A light emitting semiconductor device, comprising:
a base substrate;
a light emitting semiconductor element including a crystal growth basis and provided on the base substrate so that the crystal growth basis faces in opposite direction to the base substrate;
a first transparent sealing medium which seals the light emitting semiconductor on the base substrate; and
a second transparent sealing medium which seals the light emitting semiconductor over the first transparent sealing medium and comprises a phosphor,
wherein a thickness of the second sealing medium in a portion with high emission intensity is larger than that of an other portion of the second sealing medium; and
wherein the portion with high emission intensity is defined as a portion where a light emission intensity from the light emitting semiconductor element is maximum, and
wherein an inclination angle of a first slantingly inclined side wall of the first transparent sealing medium is less than an inclination angle of a second slantingly inclined side wall of the second transparent sealing medium.

7. The light emitting semiconductor device according to claim 1, wherein the first transparent sealing medium extends to edges of the base substrate.

8. The light emitting semiconductor device according to claim 1, wherein, from an edge of the base substrate to another edge of the base substrate, the first transparent sealing medium is disposed between the base substrate and the second sealing medium.

9. The light emitting semiconductor device according to claim 1, wherein the first sealing medium and the second sealing medium comprise a same resin.

10. The light emitting semiconductor device according to claim 1, wherein the first ceiling portion comprises a flat surface that extends parallel to an upper surface of the light emitting semiconductor element.

11. The light emitting semiconductor device according to claim 6, wherein, in the light emitting semiconductor device, a shift width of chromaticity is 0.009 or less.

12. The light emitting semiconductor device according to claim 6, wherein the first transparent sealing medium extends to edges of the base substrate.

13. The light emitting semiconductor device according to claim 6, wherein, from an edge of the base substrate to another edge of the base substrate, the first transparent sealing medium is disposed between the base substrate and the second sealing medium.

14. The light emitting semiconductor device according to claim 6, wherein the first sealing medium and the second sealing medium comprise a same resin.

15. The light emitting semiconductor device according to claim 6, wherein the first transparent sealing medium comprises a flat surface that extends parallel to an upper surface of the light emitting semiconductor element.

16. A light emitting semiconductor device, comprising:
a base substrate;
a light emitting semiconductor element provided on the base substrate;
a first transparent sealing medium which seals the light emitting semiconductor element on the base substrate and includes a first ceiling portion which is positioned over the light emitting semiconductor element, a first taper portion which includes a first slantingly inclined side wall and is provided so as to continue from the first ceiling portion, and a first R portion which includes a first curve and connects between the first ceiling portion and the first taper portion by the first curve; and
a second sealing medium which comprises a phosphor and seals the light emitting semiconductor element over the first sealing medium and includes a second ceiling portion which is positioned over the first ceiling portion, a second taper portion which includes a second slantingly inclined side wall and is provided so as to continue from the second ceiling portion, and a second R portion which includes a second curve and connects between the second ceiling portion and the second taper portion by the second curve, wherein an inclination angle of the second slantingly inclined side wall is more than an inclination angle of the first slantingly inclined side wall.

17. The light emitting semiconductor device according to claim 16, wherein the first transparent sealing medium extends to edges of the base substrate.

18. The light emitting semiconductor device according to claim 16, wherein, from an edge of the base substrate to another edge of the base substrate, the first transparent sealing medium is disposed between the base substrate and the second sealing medium.

19. The light emitting semiconductor device according to claim 16, wherein the first transparent sealing medium comprises a phosphor, and wherein the first sealing medium and the second sealing medium comprise a same resin.

20. The light emitting semiconductor device according to claim 16, wherein, in the light emitting semiconductor device, a shift width of chromaticity is 0.009 or less.

* * * * *